US012051261B2

(12) United States Patent
Rejeb Sfar et al.

(10) Patent No.: US 12,051,261 B2
(45) Date of Patent: Jul. 30, 2024

(54) SEMANTIC SEGMENTATION OF 2D FLOOR PLANS WITH A PIXEL-WISE CLASSIFIER

(71) Applicant: DASSAULT SYSTEMES, Velizy Villacoublay (FR)

(72) Inventors: Asma Rejeb Sfar, Velizy Villacoublay (FR); Louis Dupont De Dinechin, Velizy Villacoublay (FR); Malika Boulkenafed, Velizy Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 1158 days.

(21) Appl. No.: 16/235,930

(22) Filed: Dec. 28, 2018

(65) Prior Publication Data

US 2019/0243928 A1 Aug. 8, 2019

(30) Foreign Application Priority Data

Dec. 28, 2017 (EP) .................................... 17306967

(51) Int. Cl.
*G06F 30/13* (2020.01)
*G06F 18/214* (2023.01)
(Continued)

(52) U.S. Cl.
CPC .......... *G06V 30/422* (2022.01); *G06F 18/214* (2023.01); *G06F 18/2413* (2023.01);
(Continued)

(58) Field of Classification Search
CPC ........ G06F 30/13; G06N 3/08; G06V 10/454; G06V 10/82; G06V 30/422; G06T 7/10;
(Continued)

(56) References Cited

U.S. PATENT DOCUMENTS 9,865,042 B2 * 1/2018 Dai .......................... G06T 7/11
10,410,350 B2 * 9/2019 Xu ........................ G06N 3/084
(Continued)

FOREIGN PATENT DOCUMENTS

CN 101802776 A 8/2010
CN 102521877 A 6/2012
(Continued)

OTHER PUBLICATIONS

A. Balat and G. Timiropoulos, Human pose estimation via convolutional part heatmap regression, 2016, Springer, In European Conference on Computer Vision, pp. 717-732 (Year: 2016).*
(Continued)

*Primary Examiner* — Alvin H Tan
(74) *Attorney, Agent, or Firm* — Oblon, McClelland, Maier & Neustadt, L.L.P.

(57) ABSTRACT

The disclosure notably relates to a computer-implemented method for determining a function configured to determine a semantic segmentation of a 2D floor plan representing a layout of a building. The method comprises providing a dataset comprising 2D floor plans each associated to a respective semantic segmentation. The method also comprises learning the function based on the dataset. Such a method provides an improved solution for processing a 2D floor plan.

13 Claims, 10 Drawing Sheets

(A) 2D floor plan image (B) Corresponding pixel-wise labels image

(51) Int. Cl.
  *G06F 18/2413* (2023.01)
  *G06N 3/08* (2023.01)
  *G06V 10/26* (2022.01)
  *G06V 10/44* (2022.01)
  *G06V 10/764* (2022.01)
  *G06V 10/82* (2022.01)
  *G06V 30/422* (2022.01)

(52) U.S. Cl.
  CPC .............. *G06F 30/13* (2020.01); *G06N 3/08* (2013.01); *G06V 10/267* (2022.01); *G06V 10/454* (2022.01); *G06V 10/764* (2022.01); *G06V 10/82* (2022.01)

(58) Field of Classification Search
  CPC ........... G06T 17/00; G06T 2207/20081; G06T 2207/20084; G06T 2210/04
  See application file for complete search history.

(56) References Cited

U.S. PATENT DOCUMENTS

| | | | |
|---|---|---|---|
| 2003/0014224 | A1 | 1/2003 | Guo et al. |
| 2004/0249809 | A1 | 12/2004 | Ramani et al. |
| 2009/0092289 | A1 | 4/2009 | Rye |
| 2010/0214291 | A1 | 8/2010 | Müller et al. |
| 2011/0282473 | A1 | 11/2011 | Pavlovskaia et al. |
| 2015/0134578 | A1* | 5/2015 | Tamatsu ................. G06N 3/045 706/12 |
| 2016/0180195 | A1 | 6/2016 | Martinson et al. |
| 2016/0358337 | A1 | 12/2016 | Dai et al. |
| 2017/0116781 | A1 | 4/2017 | Babahajiani et al. |
| 2017/0148211 | A1 | 5/2017 | Zakhor et al. |
| 2017/0262735 | A1 | 9/2017 | Ros Sanchez et al. |
| 2017/0300811 | A1* | 10/2017 | Merhav ................. G06N 3/084 |
| 2017/0358075 | A1 | 12/2017 | Cao et al. |
| 2020/0167930 | A1 | 5/2020 | Wang et al. |

FOREIGN PATENT DOCUMENTS

| | | |
|---|---|---|
| CN | 106709481 A | 5/2017 |
| GB | 2541153 A | 2/2017 |
| JP | 2015-95212 A | 5/2015 |

OTHER PUBLICATIONS

K. He, X. Zhang, S. Ren, and J. Sun. Deep residual learning for image recognition, 2016, In Proceedings of the IEEE Conference on Computer Vision and Pattern Recognition, pp. 770-778 (Year: 2016).*

C. Liu, A. G. Schwing, K. Kundu, R. Urtasun, and S. Fidler, Rent3d: Floor-plan priors for monocular layout estimation, 2015, In Proceedings of the IEEE Conference on Computer Vision and Pattern Recognition, pp. 3413-3421 (Year: 2015).*

Extended European Search Report issued Jul. 3, 2018; in Europe Patent Application No. 17306967.5-1207. (10 pgs.).

Xuetao Yin, et al.; "Generating 3D Building Models from Architectural Drawings: A Survey"; IEEE Computer Graphics and Applications, IEEE Service Center, New York, NY, US; vol. 29, No. 1; Jan. 1, 2009; XP011241089; 11 pgs.

Samuel Dodge, et al.; "Parsing Floor Plan Images"; 2017 Fifteenth IAPR International Conference on Machine Vision Applications (MVA); May 8, 2017; XP 033126601; Retrieved on Jul. 19, 2017; 4 pgs.

Chen Liu, et al.; "Raster-to-Vector: Revisiting Floorplan Transformation"; 2017 IEEE International Conference on Computer Vision (ICCV), IEEE; Oct. 22, 2017; XP033283084; Retrieved Dec. 22, 2017; 9 pgs.

Lluis-Pere De Las Heras, et al.; "Statistical Segmentation and Structural Recognition for Floor Plan Interpretation, Notation Invariant Structural Element Recognition"; International Journal on Document Analysis and Recognition; vol. 17, No. 3; Dec. 3, 2013; XP55487069, 17 pgs.

Christophe Riedinger, et al.; "3D Models over the Centuries: From Old Floor Plans to 3D Representation"; 2014 International Conference on 3D Imaging (IC3D), Dec. 9, 2014; XP55487073; 8 pgs.

Evan Shelhamer, et al.; "Fully Convolutional Networks for Semantic Segmentation"; arxiv.org, Cornell University Library; Ithaca, NY, 14853; May 20, 2016; XP080702391, 12 pgs.

Gimenez, L., et al., "Review: Reconstruction of 3D Building Information Models from 2D Scanned Plans"; Journal of Building Engineering, pp. 24-35, 2015; (Abstract only), 1 page.

Gimenez L., et al.; "Reconstruction of 3D Building Models from 2D Scanned Plans-opening the Path for Enhanced Decision Support in Renovation Design"; ECPPM 2014; (Abstract only), 1 page.

Dominguez B., et al.; "Semiautomatic Detection of Floor Topology from CAD Architectural Drawings Computer-Aided Design"; 2012; (Abstract only), 1 page.

Gimenez L., et al.; A Novel Approach to 2D Drawings-based Reconstruction of 3D Building Digital Models, Building Information Modeling (BIM) in Design Construction and Operations; vol. 149; 2015, 11 pgs.

Heras, L.-P. de las et al., "Wall Patch-Based Segmentation in Architectural Floorplans"; ICDAR-2011; (Abstract only), 1 page.

J. Long, et al.; "Fully Convolutional Networks for Semantic Segmentation"; 2015, 10 pgs.

V. Badrinarayanan, et al.; "SegNet: A Deep Convolutional Encoder-Decoder Architecture for Image Segmentation"; 2016; 14 pgs.

LeCun et al.; "Convolutional Networks for Images", Speech, and Time-Series; 14 pgs.

Rumelhart et al.; "Learning Internal Representations by Error Backpropagation"; 1986; (Abstract only), 1 page.

GIMENEZ Lucile, et al.; "Automatic Reconstruction of 3D Building Models from Scanned 2D Floor Plans"; Automation in Construction, Elsevier, Amsterdam, NL; vol. 63; Dec. 23, 2015 (Dec. 23, 2015), XP029419399, ISSN: 0926-5805, DOI : 10.1016/J. AUTCON.2015.12.008, 9 pgs.

Vijay Badrinarayanan et al.; "SegNet: A Deep Convolutional Encoder-Decoder Architecture for Image Segmentation"; IEEE Transactions on Pattern Analysis and Machine Intelligence; vol. 39, No. 12, Oct. 10, 2016 (Oct. 10, 2016) , pp. XP055438349, USA ISSN: 0162-8828, DOI : 10.1109/TPAMI .2016.2644615, 14 pgs.

European Search Report dated Jun. 14, 2018, issued in European Patent Application No. EP17306966.7.

Japanese Notice of Reasons for Refusal issued Nov. 22, 2022, in Japanese Patent Application No. 2018-244284, 10 pages (with English Translation).

Combined Chinese Office Action and Search Report issued Apr. 27, 2023, in corresponding Chinese Patent Application No. 201811610377.3 (with English Translation), 26 pages.

Office Action issued Oct. 23, 2023 in Chinese Application No. 201811611733.3, and an English translation, (7 pgs).

Zhang, Hongxin, Li, Yuanshu, Song, Chao, "Fast 3D Building Modeling Based on Vectorization on Blocked Indoor Blueprint" Journal of Frontiers of Computer Science & Technology, Issue 1 (2013).

Lu, Zongqi; Zhu, Yu; "Implementation of Euclidean Distance Transforms Using Erosion and Dilation with Form Correction" Journal of Image and Graphics, Issue 02 (English Abstract only) (2010).

* cited by examiner (A) 2D floor plan image  (B) Corresponding pixel-wise labels image

SEMANTIC SEGMENTATION OF 2D FLOOR PLANS WITH A PIXEL-WISE CLASSIFIER

CROSS-REFERENCE TO RELATED APPLICATIONS

This application claims priority under 35 U.S.C. § 119 or 365 to European Application No, 17306967.5, filed Dec. 28, 2017. The entire contents of the above application(s) are incorporated herein by reference.

FIELD OF THE INVENTION

The invention relates to the field of computer programs and systems, and more specifically to methods, systems and programs for processing a two-dimensional (2D) floor plan representing a layout of a building.

BACKGROUND

A number of systems and programs are offered on the market for the design, the engineering and the manufacturing of objects. CAD is an acronym for Computer-Aided Design, e.g., it relates to +software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DENIM) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context and other contexts, it may be useful to provide computerized processing of 2D floor plans.

Researchers and CAD developers have notably been trying to automate and accelerate conversion of 2D architectural floor plan images into three-dimensional (3D) building models. Several state-of-the-art approaches can be found in papers [1] and [2] listed below, as well as in references cited therein.

One stage for converting 2D floor plans into 3D models may be to recognize floor plan symbols, which can be extremely different from one plan to another. For this, most approaches rely on image-processing and pattern-recognition techniques and thus lack generality. Pattern recognizers are typically constrained to a limited set of predefined symbols. Paper [3] listed below is an example of such approach.

Generally, proposed pipelines consist of first pre-processing 2D plans, as suggested for example in papers [5] and [6] listed below. For this, both image processing and text processing methods are used to separate graphics from text content. Then, the image is further cleaned by removing disruptive elements (e.g., stairs, furnishing elements) which can cause errors. At the end of this process, the aim is to select, among the remaining lines, those that represent walls. For this, a value approaching standard wall thickness has to be chosen. However, different thicknesses exist depending on the construction domain and the designers. Then outdoor walls and openings are recognized. Pattern recognition methods are generally used to determine an opening type. For instance, in the approach suggested by paper [3] an "arc" motif is searched around each opening—if the motif is found then it is set to door type, or in the opposite case to window type. Finally, indoor walls and openings are recognized. In addition to pattern recognition techniques, some works have used learning approaches especially for wall detection (e.g. wall patch-based object segmentation as suggested in paper [6]). It seems to be clear that with such pipelines, errors and inconsistencies are naturally accumulated from one step to another which would result in ineffective systems. This is why some works have attempted to involve users in the recognition process either at the beginning by for example fixing some problems in the original file, such as suggested in paper [4] listed below, or after some steps by for example proposing to the user several choices for correction, such as suggested in paper [5]. However, it is worth mentioning that statistics in paper [5] show that for the majority of the tested plans, about fifteen user interventions were required and for some plans more than forty interventions were necessary. Several user interventions lead to costly and very long processes (non-real-time).

Paper [7] discloses a method for analyzing floor plan images using wall segmentation, object detection, and optical character recognition. The method comprises parsing floor plans (section 3) including wall segmentation using a fully convolution network technique with a respective training and involving binary classification, and then object (e.g. door) detection using another and different convolution network technique with another training.

Within this context, there is still a need for an improved solution for processing a 2D floor plan.

List of Academic Papers Cited Above:
[1] Xuetao Y. et al., *Generating* 3D *Building Models from Architectural Drawings: A Survey IEEE Computer Graphics and Applications,* 2009
[2] Gimenez, L. et al., *Review: reconstruction of 3d building information models from 2d scanned plans.* Journal of Building Engineering, pp. 24-35, 2015.
[3] Gimenez L. et al. *Reconstruction of 3D building models from 2D scanned plans—opening the path for enhanced decision support in renovation design* ECPPM 2014
[4] Dominguez B. et al. *Semiautomatic detection of floor topology from CAD architectural drawings Computer-*Aided Design, 2012
[5] Gimenez L. et al. *A novel approach to 2D drawings-based reconstruction of 3D building digital models,* Building information modeling (BIM) in design construction and operations, vol 149, 2015
[6] Heras, L.-P. de las et al. *Wall Patch-Based Segmentation in Architectural Floorplans,* ICDAR-2011
[7] Dodge, S. et al. *Parsing floor plan images,* Fifteenth IAPR Internation Conference on Machine Vision Applications (MVA), Nagoya University, Nagoya, Japan, May 8-12, 2017

SUMMARY OF THE INVENTION

It is therefore provided a computer-implemented method for determining a function configured to determine a semantic segmentation of a 2D floor plan representing a layout of a building. The method comprises providing a dataset comprising 2D floor plans each associated to a respective semantic segmentation. The method also comprises learning the function based on the dataset.

In examples, the function may have a neural network. The neural network presents a convolutional encoder-decoder architecture. The neural network further comprises a pixel-wise classifier with respect to a set of classes. The set of classes comprise at least two classes among a wall class, a door class and a window class.

The neural network may comprise weights, and the learning may comprise, with an optimization algorithm, updating the weights according to the dataset and to a loss function. In examples, the optimization algorithm is a stochastic gradient descent. In examples, the loss function is a cross-entropy loss function.

The pixel-wise classifier may output, for each input 2D floor plan, respective data for inference of a semantic segmentation mask of the input 2D floor plan. The semantic segmentation mask is a pixel-wise classification of the 2D floor plan with respect to the set of classes. The loss function may penalize, for each 2D floor plan of the dataset, inference of a semantic segmentation mask erroneous relative to the respective semantic segmentation associated to the 2D floor plan in the dataset. In examples, the penalization is all the more important as the error is high (an error between the inferred semantic segmentation mask erroneous and the respective semantic segmentation associated to the 2D floor plan in the dataset).

Optionally, the pixel-wise classifier may output, for each pixel of an input 2D floor plan, respective data for inference of a class of the set of classes. The loss function may penalize, for each pixel of each 2D floor plan of the dataset, inference of a respective class different from a class provided for said pixel by the respective semantic segmentation associated to the 2D floor plan in the dataset.

Yet optionally, the respective data outputted by the pixel-wise classifier may comprise a distribution of probabilities over the set of classes.

Still optionally, the loss function may comprise a sum of loss terms each relative to a respective pixel. Each loss term may be of the type:

$$-\sum_{i=1}^{C} y_{true}^{i} \log(y_{pred}^{i})$$

where:
C is the number of classes of the set of classes;
i designates a class of the set of classes;
$y_{true}^{i}$ is a binary indicator if class i is the class provided for the respective pixel by the respective semantic segmentation associated to the 2D floor plan in the dataset; and
$y_{pred}^{i}$ is a probability outputted by the pixel-wise classifier for class i.

Still optionally, the loss function may be multinomial. The method may comprise one or more of the following:
the function presents a mean accuracy higher than 0.85 and/or a mean intersection-over-union higher than 0.75;
the function presents a convolutional encoder-decoder neural network architecture;
the learning comprises a stochastic gradient descent;
the stochastic gradient descent is based on a cross-entropy loss function; and/or
providing the dataset comprises providing a database of 2D floor plans each associated to a respective 3D model, and determining for each 2D floor plan the respective semantic segmentation from the respective 3D model.

It is further provided a computer-implemented method for determining a semantic segmentation of a 2D floor plan representing a layout of a building. The method comprises providing the 2D floor plan, applying a function to the 2D floor plan, the function being learnable according to the above learning method.

It is further provided a computer-implemented method for generating a 3D model representing a building. The method comprises providing a 2D floor plan representing a layout of the building. The method also comprises determining a semantic segmentation of the 2D floor plan according to the above semantic segmentation method. The method also comprises determining the 3D model based on the semantic segmentation.

The 3D model generation method may comprise one or more of the following:
the method further comprises converting the semantic segmentation into a 2D model representing the layout of the building, determining the 3D model being performed from the 2D model;
converting the semantic segmentation into the 2D model comprises, for each respective one of a predetermined set of architectural object classes, determining a mask based on the semantic segmentation, and generating the 2D model based on the determined masks,
determining the mask for each respective class comprises an initialization with all pixels of the semantic segmentation corresponding to the respective class, a skeletonising, and a merge of line segments to reduce the number of line segments; and/or
the predetermined set of architectural object classes comprises the wall class and generating the 2D model comprises a junction of line segments in the mask respective to the wall class.

It is further provided a computer program comprising instructions for performing any one or more of the above methods.

It is further provided a device comprising memory having recorded thereon the data structure and/or the program. The device may form or serve as a non-transitory computer-readable medium, for example on a SaaS (Software as a service) or other server, or a cloud based platform, or the like. The device may alternatively comprise a processor coupled a graphical user interface coupled to the memory to the memory. The device may thus form a computer system in whole or in part (e.g. the device is a subsystem of the overall system). The system may further comprise a graphical user interface coupled to the processor.

It is thus provided a computer readable storage medium having recorded thereon the computer program.

It is thus also provided a system comprising a processor coupled to a memory and a graphical user interface, the memory having recorded thereon the computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
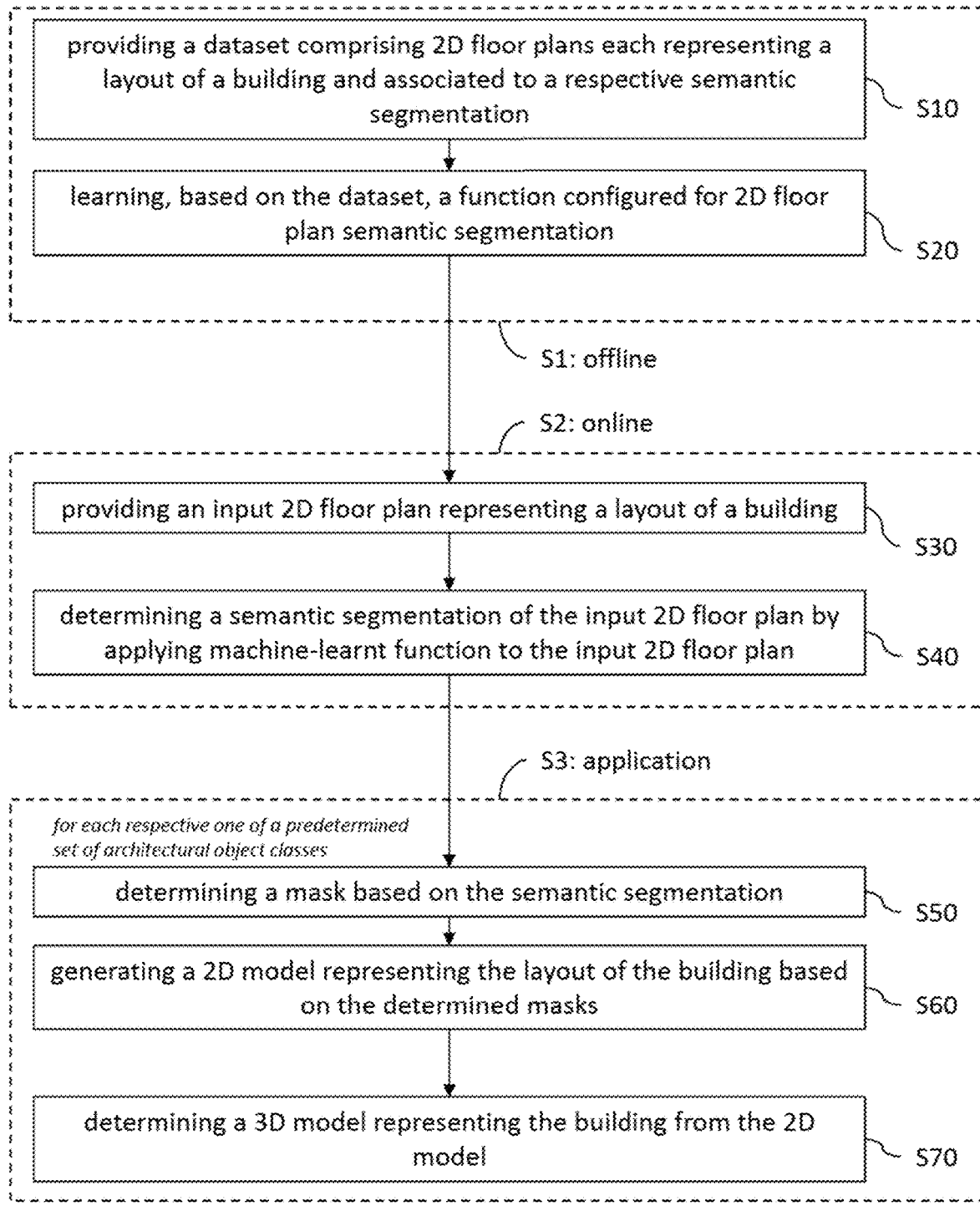
FIG. 1 shows a process integrating the method.

FIG. 1 shows a process for architectural 3D reconstruction. The process is in particular for constructing a 3D model, the 3D model representing a building. The process is based on an input 2D floor plan, the input 2D floor plan representing a layout of the building.

The process involves machine-learning in order to determine a semantic segmentation of the input 2D floor plan.

In particular, the process comprises an offline stage S1 for determining (in the present case, i.e. learning, i.e. training) a function configured to determine (e.g., compute and/or output) a semantic segmentation of any given 2D floor plan (each said given 2D floor plan representing a layout of a respective building). The offline stage S1 comprises providing S10 a dataset. The dataset comprises 2D floor plans. Each 2D floor plan is associated to (in the dataset, i.e. linked to, i.e. connected to, i.e. in relation with) a respective semantic segmentation. The offline stage S1 also comprises learning (i.e. training) S20 the function based on the dataset.

The process comprises, after the offline stage S1, an online (i.e. inline) stage S2. The online stage S2 comprises providing the input 2D floor plan. The online stage S2 also comprises applying the function (machine-learnt within the offline stage S1) to the input 2D floor plan, thereby determining said semantic segmentation of the input 2D floor plan.

The offline stage S1 and the online stage S2 may be launched and/or performed at different times, at different locations, with different systems and/or by different persons or entities. For example, the offline stage S1 may be performed by a software editor and/or at a production line, or by a service provider and/or fully at a server. The online stage S2 may be performed by a user and/or at least partly at a client computer.

The use of such machine-learning to perform 2D floor plan semantical segmentation allows reaching a relatively accurate and robust result (notably in view of the diversity of representations used for 2D floor plans due to the lack of any standard). Also, the use of machine-learning to perform floor plan semantical segmentation allows reaching such result relatively efficiently and/or relatively fast (e.g. in substantially real-time and/or with only few or substantially no user interventions, e.g. the determining S40 being performed fully automatically once launched).

The function and the learning S20 may be of any way kind. In examples, the learning S20 may notably be performed by deep-learning. In examples discussed later, the deep-learning may be of the kind where the function presents a convolutional neural network (CNN) architecture, and more particularly a convolutional encoder-decoder neural network architecture. Such examples of the learning S20 are particularly efficient. In other examples, the function may be learnt by other machine-learning techniques, such as "random forest", Markov random fields, SVM (Support Vector Machine). Such algorithms may take as input unlearnt features such as SIFT or HoG.

Alternative processes for architectural 3D reconstruction may yet determine at S40 the semantic segmentation of the input 2D floor plan in other ways. Such alternative processes may be identic to the process of FIG. 1 for the other aspects, with the exception that the offline stage S1 may optionally be discarded since no machine-learnt function is needed at S40.

In general, the semantic segmentation may be used in any application. For example, the semantic segmentation may be used for object detection and/or for annotation.

In the case of the process of FIG. 1, the semantic segmentation is used in an application S3 for generating a 3D model representing the building corresponding to the input 2D floor plan. The semantic segmentation may indeed be based upon for determining such 3D model. The 3D model may later be used in any way, for example to create virtual interior designs of the building.

Application S3 may be performed at a different time, at a different location, with a different system and/or by a different person or entity, relative to online stage S2. Alternatively, application S3 may follow online stage S2 seamlessly and/or be launched automatically after online stage S2. In examples, a user only provides the input 2D floor plan at S30 and the system automatically executes all steps to output the 3D model. In other examples, the user may intervene to validate results, for example after the determining S40 to validate and/or correct the semantic segmentation.

In the example of FIG. 1, application S3 comprises in particular converting S50-S60 the semantic segmentation into a 2D model representing the layout of the building. The determining S70 the 3D model is then performed from the 2D model. Such a process forms an efficient pipeline for generating a 3D model from the input 2D floor plan. The input 2D floor plan indeed provides unorganized 2D information relative to the building. The process proposes to first organize such information by determining the semantic segmentation within S2. Then, rather than converting the 2D semantic segmentation directly into 3D geometry, the process proposes to construct a 2D model out of the semantic segmentation. Such intermediary data structure allows eventually constructing the 3D model more easily.

The term "building" designates any architectural structure. A "building" contemplated by the process may be a flat, an apartment, a multi-story building, a mansion, a house, a villa, a monument, or any other construction comprising walls, windows and/or rooms.

The term "layout" designates for a building a 2D arrangement of instances of architectural objects constituting the building. A layout may describe 2D arrangement of a single floor or of several floors, or yet of one or more portions thereof. The following discussions apply to layouts relating to a single floor, but adaptation to the case of several floors is straightforward.

An "architectural object" is any object involved in the formation of any building. The architectural object classes contemplated by the process may be those of a predetermined set of architectural object classes (that is, pre-stored in the system, and to which the loop implemented at S50 is limited). The predetermined set of architectural object classes may comprise or consist of any one or any combination (e.g. all) of the following classes: the wall class, the window class, and/or the door class. Architectural objects may belong to other classes, such as roofs or foundations, but these classes may be unrepresented on layouts.

The term "2D floor plan" designates as known per se an image representing a drawing of a layout of a building. The drawing comprises lines, possibly of various thicknesses, and symbols. A 2D floor plan may be sketched, for example manually sketched on a physical support (such as paper) and then scanned or photographed, or for example digitally sketched (via user-interaction with a sketching software, using for example a touch pen and/or a touch screen), or yet automatically generated by a program. Although different rules may exist to draw a 2D floor plan, there is no standard. The dataset provided at S10 may notably comprise 2D floor plans drawn at least two of which using a respective one of different sets of rules and/or one or more 2D floor plans sketched e.g. manually and/or digitally. The input 2D floor plan provided S30 may be sketched (i.e. by a user of the system or previously by another person).

The term "semantic segmentation" designates as known per se for an image any partition or segmentation of the image wherein each image portion or segment of the partition is assigned or associated to a class of objects represented by the image portion. For a 2D floor plan, a "semantic segmentation" is similarly such a partition, wherein 2D floor plan's portions may be assigned to a respective one of the above-mentioned predetermined set of architectural object classes. In examples, 2D floor plan's portions may each be assigned either to a respective one of the above-mentioned predetermined set of architectural object classes or to a common class representative of other types of objects and/or background (and thus to be discarded by the rest of the process).

The semantic segmentation determined by the process may implement such assignment in any way. In examples, the assignment may be performed by providing labels each corresponding to a respective one of the predetermined set of architectural object classes and associating portions of the 2D floor plan each to a respective label. In examples, the semantic segmentation may be a pixel-wise semantic segmentation. The determining S40 may consist in such a case of assigning pixels of the 2D floor plan each to a respective predetermined label.

The process comprises converting S50-S60 the semantic segmentation into a 2D model representing the layout of the building.

The 2D (resp. 3D) model is a data structure representing a 2D (resp. 3D) arrangement of 2D (resp. 3D) modeled object each representing a respective instance of an architectural object. The data structure may comprise pieces of data each including respective data fields, with one or more of the data fields representing a respective 2D (resp. 3D) modeled object, and one or more of the data fields representing 2D (resp. 3D) positioning, e.g. respective to a common 2D (resp. 3D) reference frame. Such a data structure allows description of precise relative positioning between the represented architectural object instances. The 2D model offers description of 2D arrangement at a higher level than the semantic segmentation.

A 2D (resp. 3D) modeled object is a data structure comprising 2D (resp. 3D) geometrical data and/or topological information allowing (e.g. linear-time) parametric transformations, such as 2D (resp. 3D) manipulation (e.g. rigid motion, scaling, and/or any other geometrical transformation, and/or CAD operations).

The 2D model may be constrained to a predetermined set of 2D geometrical shapes or primitives (e.g. including line segments with various thicknesses, and/or arcs). Such 2D primitives may each be fully characterized and represented by a respective number of predetermined of parameters. Such number may be low, e.g. inferior to 20 or 10. For example a straight line with a thickness may be represented by five parameter (e.g. coordinates of extremities, and thickness).

The 2D model may for example be a 2D vector image.

The 3D model may for example be a CAD model, such as a boundary representation (B-Rep), including geometrical objects such as canonical surfaces (e.g. planes) and/or parametric surfaces (e.g. continuous, e.g. NURBS or B-splines), canonical curves (e.g. lines) and/or parametric curves (e.g. continuous) and/or 3D points, and topological data relating these geometrical objects (e.g. defining a boundary relationship). The 3D model may be outputted as a CAD file under any standard, such as a STEP file or any other CAD file format.

Converting S50-S60 the semantic segmentation into a 2D model representing the layout of the building may be performed relatively easily. Such conversion may indeed be performed with a computational complexity of the order of the image size of the semantic segmentation (i.e. size of the input 2D floor plan) e.g. including looping one or more times on the semantic segmentation.

The converting S50-S50 may in particular comprise transforming connected portions of the semantic segmentation each associated to a respective architectural object class each into a respective 2D modeled object representing an instance of the respective architectural object class, and then rearranging the 2D modeled object according to predetermined rules which ensure architectural coherence. In the case of a pixel-wise semantic segmentation, the transforming may comprise grouping pixels into largest connected portions representative of a respective instance of an architectural object class and then reworking the connected portions to regularize them.

The process of FIG. 1 further proposes to perform the converting S50-S60 on an architectural object class-by-class basis (i.e. looping on said classes). This allows an easier processing and achieving a more accurate result. In particular, for each architectural object class, the process comprises determining S50 a mask based on the semantic segmentation. The 2D model is then generated at S60 based on the masks determined at S60. Each mask is an image of the same size as the semantic segmentation (determined at S40 and inputted to the application S3), each mask representing elements (e.g. pixels) of the semantic segmentation associated to a respective class. The generating S60 may comprise the above-mentioned grouping, transforming (optional), and rearranging. The grouping and the transforming may be performed on a mask-by-mask basis, e.g. without ever using information other than the one in the mask. This simplifies the process. The rearranging may also be performed on a mask-by-mask basis, but for at least one mask using information in one or more other masks.

Determining S70 a 3D model representing the building from the 2D model may also be performed relatively easily. Indeed, each architectural object instance in the 2D model may directly yield a respective architectural object instance in the 3D model. The determining may be performed using any known algorithm. The determining S70 may notably comprise adding, to each 2D modeled object of the 2D model, respective 3D positioning data and/or height data. In examples, these data may be predetermined in any way or specified via user-interaction. The determining S70 may also comprise compatibility/consistency check and/or management.

The process is computer-implemented. This means that steps (or substantially all the steps) of the process are executed by at least one computer, or any system alike. Thus, steps of the process are performed by the computer, possibly fully automatically, or, semi-automatically. In examples, the triggering of at least some of the steps of the process may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a process is to perform the process with a system adapted for this purpose. The system may comprise a processor coupled to a memory and a graphical user interface (GUI), the memory having recorded thereon a computer program comprising instructions for performing the process. The memory may also store a database. The memory is any hardware adapted for such storage, possibly comprising several physical distinct parts (e.g. one for the program, and possibly one for the database).

The system may be a CAD system and/or the 3D model of the building may be loaded in a CAD system. By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

Figure 2:
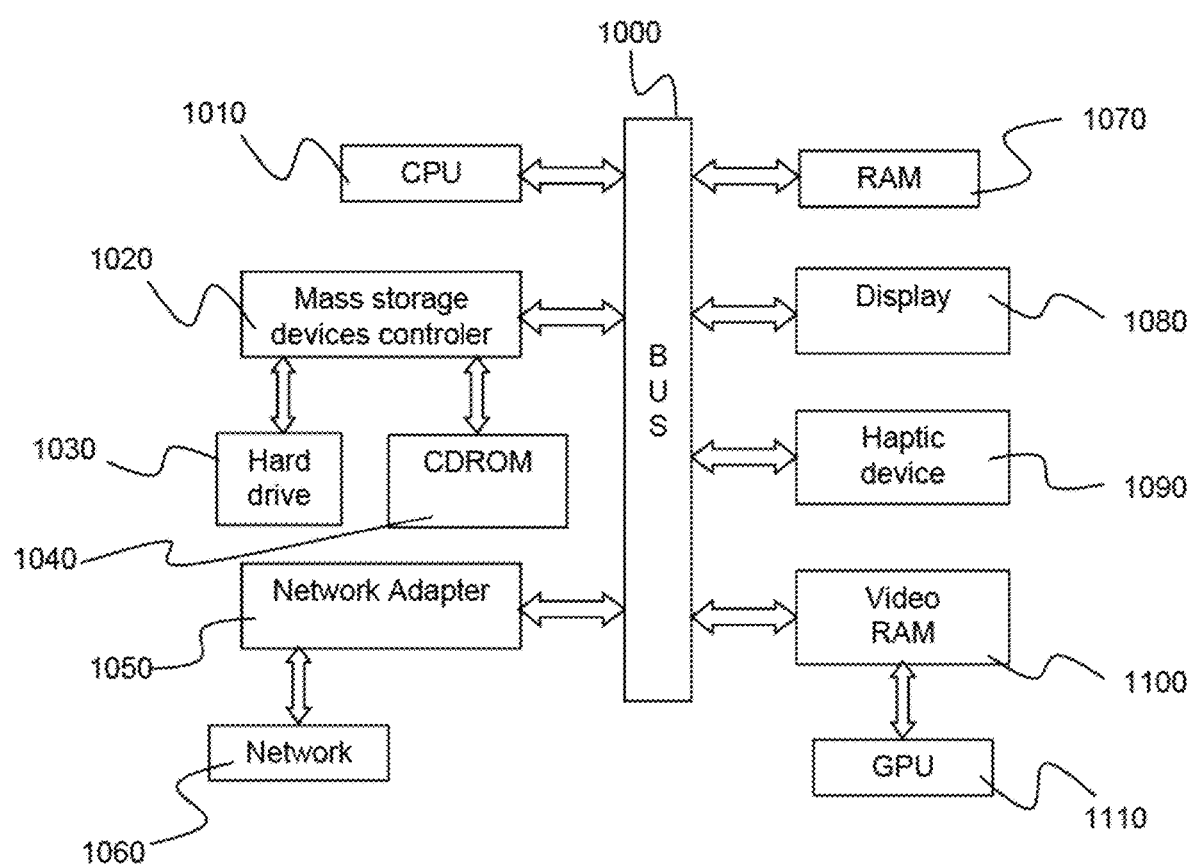
FIG. 2 shows an example of the system.

FIG. 2 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the process. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Process steps may be performed by a programmable processor executing a program of instructions to perform functions of the process by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the process.

Examples of the process are now discussed.

The process of the examples relates to floor plan generation. In particular, it concerns floor plan analysis through semantic segmentation. Given a floor plan in the form of an image, all symbols may be simultaneously recognized and located at a pixel-wise level. The process of the examples may be useful in many applications such as 3D building generation and design making. The process of the examples forms a novel floor plan generation framework. Features of the process of the examples may include:

End-to-end approach which allows avoiding the error accumulation effect present within approaches comprising several steps.

Independence from the symbol types. Other symbol types can be easily integrated. No particular constraint is required.

First approach based on deep convolutional neural networks.

The process of the examples belongs to the field of generating a 3D building model, in which given a 2D floor plan image the process of the examples may reconstruct structural building elements like walls (external/internal), openings (doors/windows) and spaces to get an exploitable 3D model, also referred to as "3D floor plan".

The generation of a 3D building model from a 2D floor plan image input may be based on:

1. Semantically recognizing each structural element of the 2D floor plan. This may be done thanks to a semantic segmentation which consists in assigning semantic information to each pixel of the 2D floor plan in input (examples of semantics including: wall, door, and/or windows.
2. Generating a 3D floor plan based on the results provided by, the previous step.

Several characteristics of the available data input make the approach of generating 3D building models given a 2D floor plan image extremely challenging. That is why most current systems share a common shortcoming which is the lack of generality.

2D floor plans may often be scanned and may be either hand-drawn or computer-produced. Floor plans may also have various levels of detail. The most widely distributed form of floor plans lacks detailed construction information. Still, floor plans manage to cover the building's complete layout, which may be sufficient to build a model for most applications. Whether these less-detailed floor plans are hand-drawn or computer-produced, they may use varying graphic symbols, which is a major drawback. Indeed, no standard exists.

Figure 3:
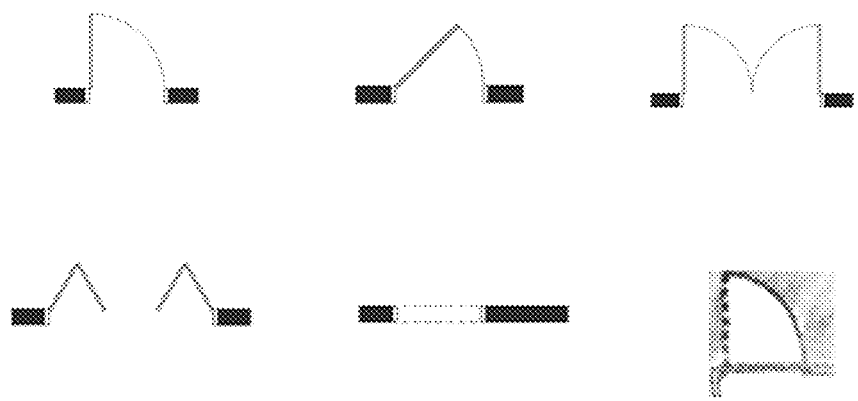
FIGS. 3, 4, 5, 6, 7, 8, 9, 10, 11, 12, 13, 14, 15, 16, 17, 18 and 19 illustrate the process.
Figure 4:

FIGS. 3 and 4 respectively show examples of common styles for doors and walls. Instead of being constrained to a particular standard, the drawing's purpose (and the designer's artistic motivation) may determine what components may, be shown and how they may look. This creates a major challenge in analyzing and interpreting a floor plan image, especially for automatic systems. FIGS. 3-4 notably show different ways to draw a door symbol (FIG. 3) and a wall (FIG. 4) for floor plans. Symbols can be either hand-drawn or computer-produced. The variable graphic symbols pose challenges for automatically converting 2D scanned floor plans into 3D models.

Figure 5:
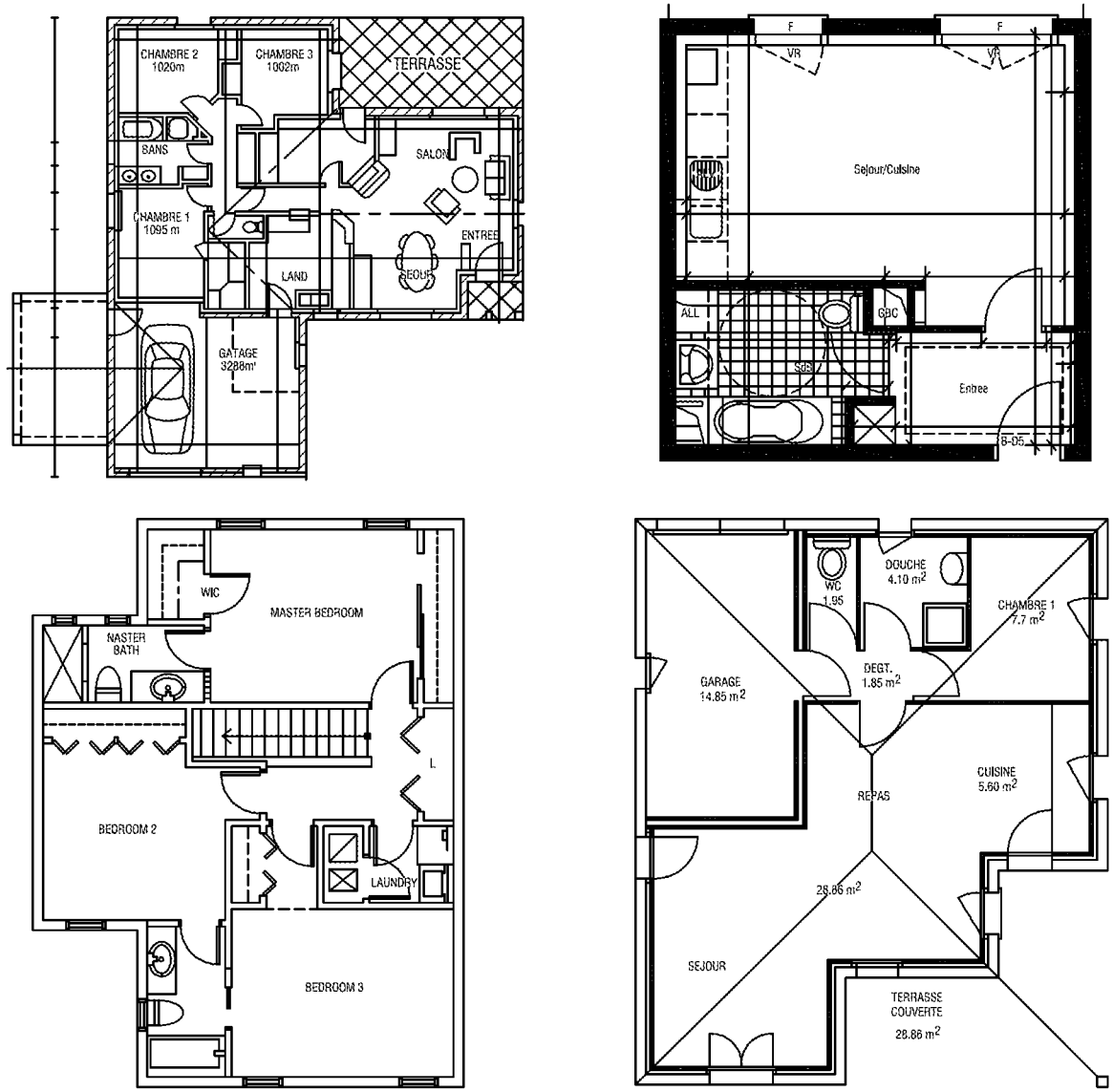

Also, floor plans may contain not only structural elements but also textual content, dimensions, scales and leading lines (that is, the straight lines that lead to measurement or text). FIG. 5 notably shows examples of common scanned floor plans. Different (graphical and textual) elements other than structural ones may be represented.

One goal of the process of the examples may be to provide a generic solution for 3D building model generation given a 2D floor plan image; a solution which simultaneously recognizes the semantics and the topology of structural 2D elements of the plan. It may consist of a framework which leverages the efficiency of semantic segmentation methods, namely those using Deep Neural Networks.

Different notions involved in the process of the examples are now discussed.

Semantic segmentation attempts to semantically understand the role of each pixel in the image, i.e. to partition the image into semantically meaningful parts, and to classify each part into one of the pre-determined categories. It can be considered as a pixel-wise classification, where classification is the problem of identifying to which of a set of categories a new observation belongs, on the basis of a training set of data containing observations (or instances) whose category membership is known. An example would be: separating a person from the background in a given image, or even the portioning of a person's body into its various parts.

Figure 6:
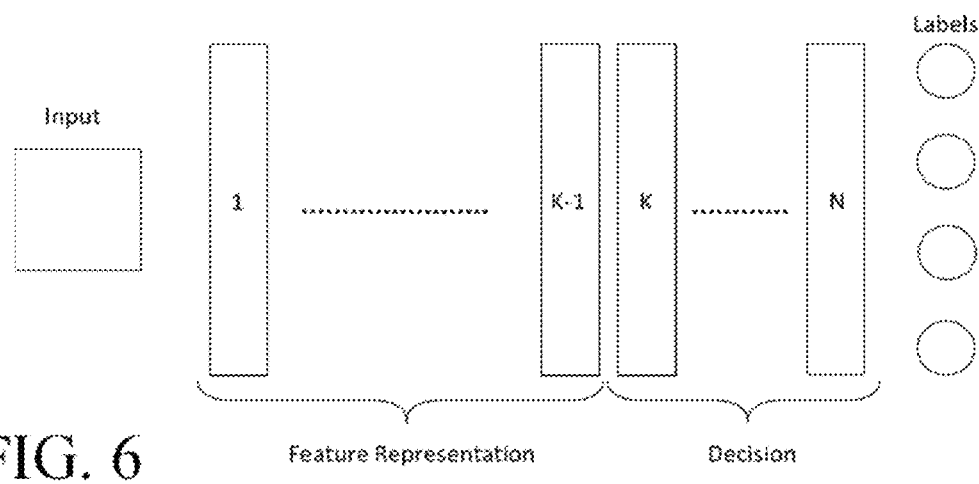

Deep Neural Networks (DNNs) are a powerful set of techniques for learning in Neural Networks (as discussed in Rumelhart et al. *Learning internal representations by error back propagation,* 1986) which is a biologically-inspired programming paradigm enabling a computer to learn from observational data. DNNs present an ability to learn rich midlevel 2D image representations as opposed to hand-designed low-level features (as discussed in Zernike moments, HOG, Bag-of-Words, SIFT, etc.) used in other image classification methods (SVM, Boosting, Random Forest, etc.). More specifically, DNNs are focused on end-to-end learning based on raw data. In other words, they move away from feature engineering to a maximal extent possible, by accomplishing an end-to-end optimization starting with raw features and ending in labels. FIG. 6 illustrates a Deep Neural Network.

Figure 7:
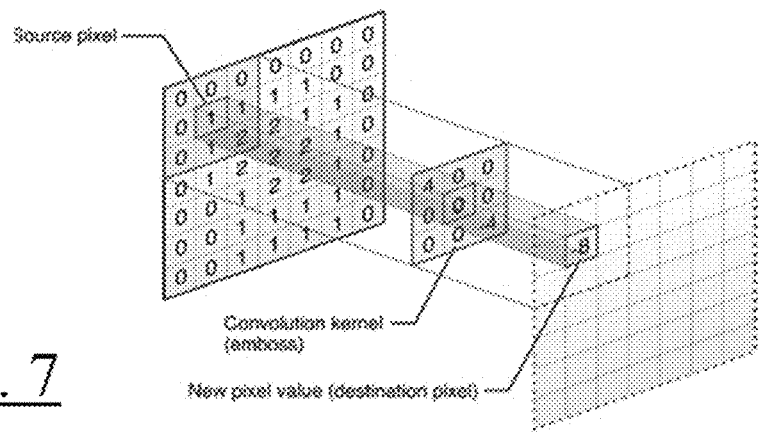

Convolutional Neural Networks (as discussed in LeCun et al. *Convolutional Networks for images, Speech, and Time-Series*) are a special case of Deep Neural Networks where at least one layer contains convolutional filters. Those filters are applied everywhere in the input and give as output a feature map. This feature map shows areas of activation where some specific patterns in the input were recognized by the filter. The advantage of Deep Learning, when stacking several convolutional layers, is to provide a way to extract very complicated but powerful features that are more sophisticated than basic features obtained by descriptors. Fully Convolutional Neural Networks are convolutional neural networks where all learned layers are convolutional. DNNs based on fully convolutional networks present the ability to take inputs of arbitrary sizes and to produce correspondingly-sized output using upsampling layers. FIG. 7 shows an example of a convolutional filter.

Upsampling refers to any technique that upsamples an image (or a feature map) to a higher resolution. The easiest way is using resampling and interpolation. This is taking an input image, rescaling it to the desired size and then calculating the pixel values at each point using an interpolation method such as bilinear interpolation.

Figure 8:
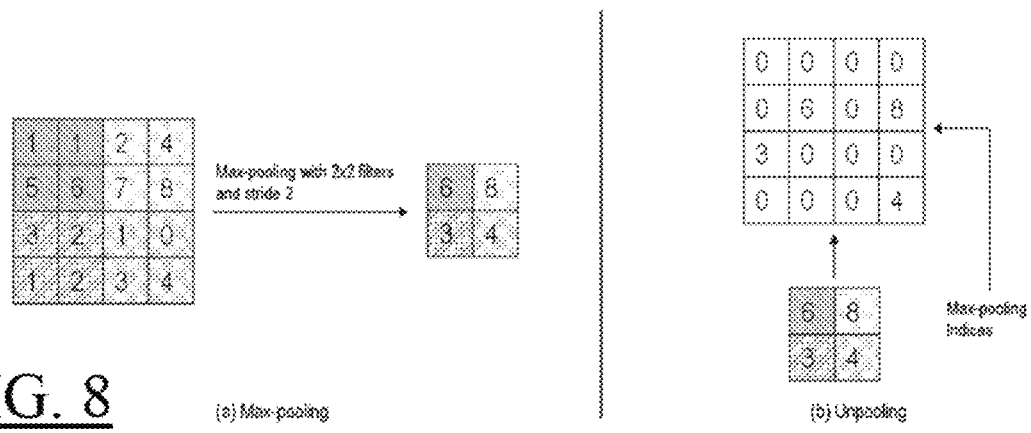

Unpooling is commonly used in the context of convolutional neural networks for upsampling. FIG. 8 shows an example of upsampling based on unpooling where max-pooling indices are used to upsample the input feature map.

Figure 9:
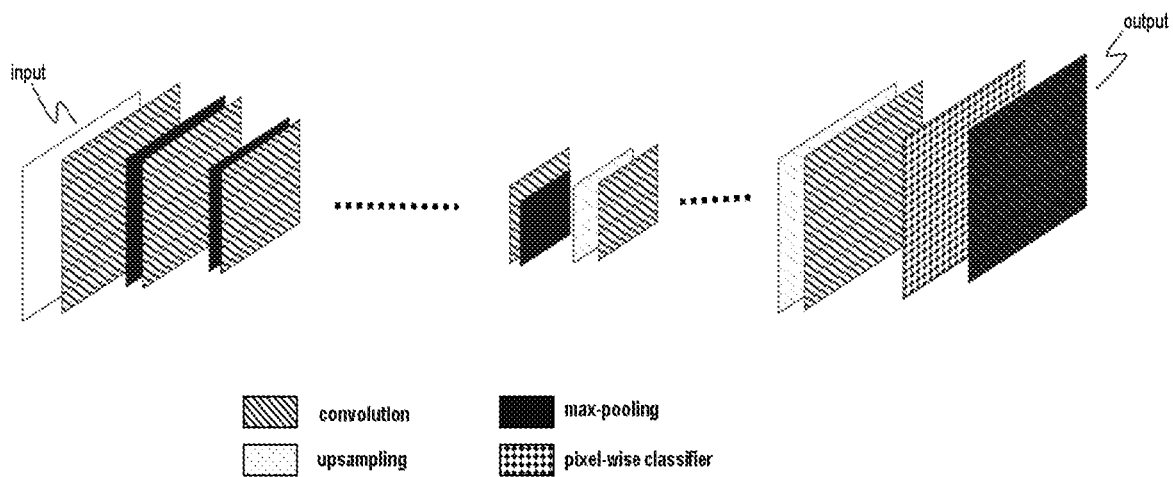

Encoder-decoder networks designate a specific type of DNNs. Some DNNs can be seen as encoder-decoder networks, where the encoder maps input data to a different (generally lower dimensional, compressed) feature representation, while the decoder maps the feature representation back into the input data space. Fully convolutional networks can be considered as a fully convolutional encoder followed by a decoder comprising an upsampling layer and a pixel-wise classifier. FIG. 9 shows an example of a Convolutional Encoder-Decoder network for semantic segmentation.

Integration of these notions to the process of the examples is now discussed with reference to FIG. 11.

The process of the examples may decompose in two stages. The first stage denoted as "offline" stage may rely heavily on Deep Neural Networks, and correspond to the stage where the segmentation model is learnt, and this may be done once and for all. The term offline refers to the fact that this stage is transparent to the user of the method and even if there are large computational needs, time to do computations can be taken.

Figure 10:
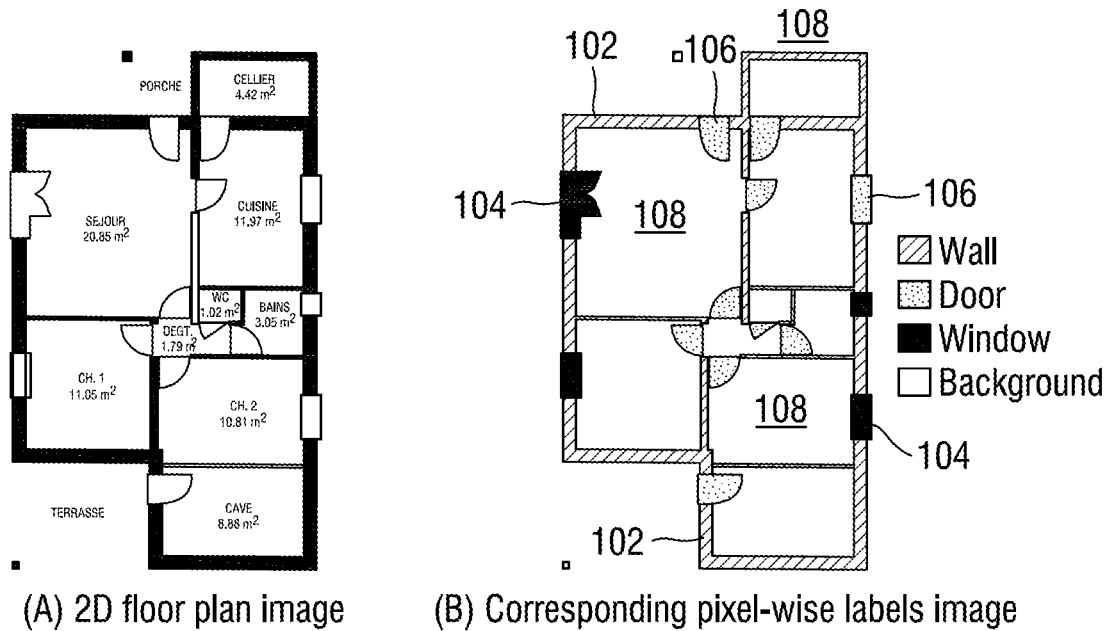

To learn a segmentation model, the process of the examples may use the following inputs:
1. A training dataset of pairs of 2D floor plan images and their corresponding pixel-wise labels images. In tested implementations, four category labels were considered: "Wall", "Door", "Window", and "Background". Each pixel of each training image was then associated to one of these labels. FIG. 10 shows such a training pair of images, with walls 102, windows 104, doors 106, and background 108.
2. An (untrained) encoder-decoder network. In tested implementations, two different state-of-the art networks were considered.
   (i) AlexNet-based fully convolutional network (J. Long et al. Fully Convolutional Networks for *Semantic Segmentation* 2015) which consists of a fully convolutional encoder comprising eight convolutional layers (with pooling layers) followed by a decoder comprising an upsampling layer and a pixel-wise classifier soft ax classifier).
   (ii) SegNet network (V. Badrinarayanan et al. *SegNet: A Deep Convolutional Encoder-Decoder Architec-*

*ture for image Segmentation* 2015) which consists of a fully convolutional encoder comprising thirteen convolutional layers (with pooling layers) and a fully convolutional decoder comprising also thirteen convolutional layers (with upsampling layers as described with reference to FIG. 8). The architecture of this network is topologically identical to the example of FIG. 9.

The SegNet network performed better than the AlexNet-based fully convolutional network.

The second stage which denoted as "online" stage gathers all the steps of the process that are done in real-time during the process of segmenting an unseen 2D floor plan image and generating the corresponding 3D building.

Note that user intervention can be optionally added at the end of the semantic segmentation process to validate the result before generating the 3D model.

Figure 11:
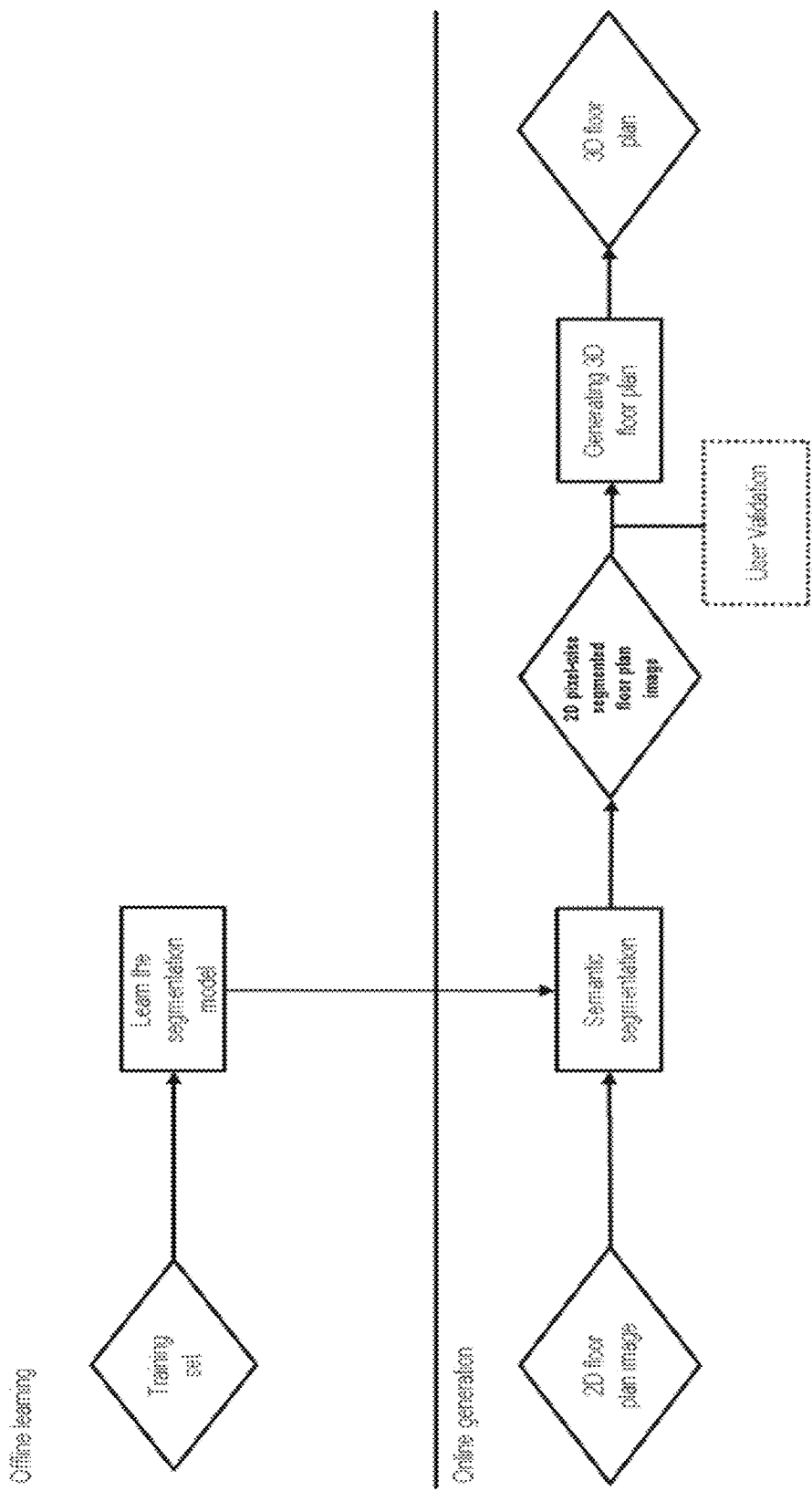

FIG. 11 illustrates the technological workflow of the offline and the online stages.

The process of the examples may then apply several methods in order to enhance the semantic segmentation results given by the previous semantic segmentation algorithm. This is in contrast with the solution presented in earlier-discussed paper [1], where the algorithms do take into account the strong geometric constraints relative to 2D floor plans. For instance, the width of a door, wall part, is always locally the same in this piece of prior art. Noise reduction techniques may be applied to purge false positives.

Finally, the provided semantic mask may be used to extract topological information required by the 3D reconstruction APIs. In fact, to facilitate further exploitation of the resulting 3D floor plan, it may be useful to have it aligned with applicable standards, such as for example "Building Smart IFC format" (which was used in earlier-discussed paper [3]).

Specificities of the process of the examples are now discussed in more details, with reference to the following academic papers:

[A] "ImageNet Classification with Deep Convolutional Neural Networks", Alex Krizhevsky & Al

[B] "Very Deep Convolutional Networks For Large-Scale Image Recognition", Karen Simonyan & Andrew Zisserman

[C] "Deep Residual Learning for Image Recognition", Kaiming He & Al

[D] "Fully convolutional networks for semantic segmentation," J. Long, E.

Shelhamer, and T. Darrell, in CVPR 2015

[E] "SegNet: A Deep Convolutional Encoder-Decoder Architecture for Image Segmentation", Vijay Badrinarayanan, Alex Kendall, Roberto Cipolla, 2015

[F] "Pyramid Scene Parsing Network", Hengshuang Zhao, Jianping Shi, Xiaojuan Qi, Xiaogang Wang, Jiaya Jia, CVPR 2017

[G] "RefineNet: Multi-Path Refinement Networks for High-Resolution Semantic Segmentation", Guosheng Lin, Anton Milan, Chunhua Shen, Ian Reid, 2016

[H] "Fully Convolutional Networks for Semantic Segmentation", Jonathan Long, Evan Shelhamer, Trevor Darrell, CVPR 2015

[I] "CVC-FP and SGT: a new database for structural floor plan analysis and its groundtruthing tool", International Journal on Document Analysis and Recognition (LIDAR), Lluís-Pere de las Heras, Oriol Ramos Terrades, Sergi Robles, Gemma Sánchez Examples of implementation of the learning S20 are now discussed.

This step may consist in learning a function which takes as input the 2D floor plan image and returns a semantic segmentation mask which is a pixel-wise classification of the input image. The classes may be predefined. This semantic segmentation mask is an image with the same dimensions as the input image and which pixels can take several values (e.g. colors) corresponding to the predefined classes. In tested implementations, the following classes were chosen: "wall", "door", "window" and "background". The last class described every pixel that does not belong to one of the other classes.

Learning Function Characterization:

The learning function may be implemented as a convolutional neural network. The function may notably present a convolutional encoder-decoder neural network architecture. In other words, the neural network may be an encoder-decoder which is a type of neural network used to perform semantic segmentation on natural images. Although this type of neural networks can exploit continuities in natural images relatively well and thereby provide good results in such a context, it is not a priori efficient with images including sparse information such 2D floor plans. Tests were however performed and showed that this type of neural networks performed well in the 2D floor plans context of the process as well.

Learning a neural network may comprise three main ingredients:

1. Neural architecture: number of layers, number of neurons per layer, types of neuron.
2. Optimization algorithm: it is used to update the parameters/weights of the neural network according to the annotated dataset and the loss function values.
3. Annotated dataset.

The neural architecture of the neural network may be a convolutional encoder-decoder architecture described as follows:

1. Convolutional Encoder: The encoder network takes as input the floor plan image. It comprises a succession of convolutional layers between which pooling layers may be interleaved. Usually, the convolutional encoder may correspond to a well-known convolutional architecture such as AlexNet [A], VGG16 [B], ResNet [C], or other CNN architectures.
2. Convolutional Decoder: The decoder network takes as input the output of the encoder network. It may comprise a succession of convolutional layers between which upsampling layers is interleaved. The output of the last convolutional layers may have the same dimensions as the input floor plan image. The decoder may be the symmetric of the encoder network by replacing the pooling layer by an upsampling layer. However, the decoder network may alternatively have a distinct architecture. The only constrain that may be respected is that the output may have the same dimensions as the ones of the input 2D floor plan image.

In well-performing tests, the SegNet architecture defined in [E] was used. Other neural architectures may be used such as the PCN defined in [H], the PSPNet defined in [F], or the RefineNet defined in [G].

The learning may comprise a stochastic gradient descent. Optionally, the stochastic gradient descent may be based on a cross-entropy loss function. In other words, the optimization algorithm may be the stochastic gradient descent. The loss function may compute during the learning process the error between the semantic segmentation mask returned by the network and the ground truth semantic segmentation mask associated with the 2D floor plan in the training dataset. The cross-entropy loss function defined in [D] was notably tested.

Dataset Characterization:

The training dataset may be a set of 2D floor plan images, each of which is associated with a pixel-wise labeled image also called a ground truth semantic segmentation mask.

The characteristics of the training dataset to ensure precise results of the learning function may be as follows:

Sufficient data: the dataset may contain more than 500, 750 or 1000 different 2D floor plan images.

Relevant data: the diversity of floor plans in the dataset may correspond to floor plans the learnt function will process. Particularly, the diversity of symbols (walls, windows, doors) within the training dataset may cover the ones contained by floor plan images the learnt function will process.

The dataset may be split into three sub-datasets which form a partition of the whole dataset. The first subdataset is called the "training dataset" and contains the data used to learn the function. The second subdataset is called the "validation dataset" and contains the data used to check during the learning that the function is still improving by computing its temporary accuracy. The third subdataset is called the "test dataset" and contains the data used once the learning is done. The test dataset may be used to evaluate the final semantic segmentation accuracy. The training dataset may contain at least 80% of the whole dataset. The validation and the test dataset may be an equal split of remaining data.

An efficient way to build such a dataset to provide at S10 may be to reuse existing databases of 2D floor plans each associated to a respective 3D model. If such a database is available, the dataset can be constructed easily by determining for each 2D floor plan the respective semantic segmentation from the respective 3D model (since the 3D model provides the class for each object).

Semantic Segmentation Accuracy:

To evaluate a semantic segmentation accuracy on an annotated dataset, an evaluation metric may be defined. For the task of semantic segmentation, two evaluation metrics may be used:

1. Mean Accuracy: it corresponds to the mean percentage of well-classified pixels
2. Mean IoU (i.e. Intersection over Union): it corresponds to the intersection of the inferred segmentation and the ground truth, divided by the union of both.

Tests were performed on a dataset comprising 880 floor plan images. This dataset was built based on 2D floor plan images stemming from an open source database (presented in [I]) which was augmented thanks to transformations, such as mirrors and rotations (90°, 180° and 270°). With such tests, a mean accuracy of 0.88 and a mean IoU of 0.78 were obtained. In general, when the function presents a mean accuracy higher than 0.85 and/or a mean intersection-over-union higher than 0.75, the semantic segmentation may be particularly accurate. The semantic segmentation accuracy may be relevant since the next step takes as input the output of the learnt function. Empirically, it can be found that the mean accuracy may be over 0.85 and the mean IoU over 0.75, otherwise the reconstructed 3D floor plan may contain mistakes. Indeed, semantic segmentation masks are sparse.

The following discusses examples of application S3, and in particular provides implementation details of primitive extraction.

In the discussed examples below, determining at S50 the mask for each respective class comprises a sub-process comprising: an initialization (of a mask) with all pixels of the semantic segmentation corresponding to the respective class, a skeletonizing of the mask, and a merge of line segments (or more simply "segments") in the mask to reduce the number of line segments. The remainder of the process may then be performed based on the result outputted by the sub-process. In examples of implementation, at the merge of line segments, pairs of line segments above a first predetermined collinearity threshold and below a predetermined distance threshold may be merged, as mentioned below. Such sub-process allows reducing the unorganized data to a more synthetic format.

In further examples, the method may comprise a junction of line segments in the mask respective to the wall class, and/or a projection of line segments of the mask respective to the window class and/or line segments of the mask respective to the door class, each onto a respective line segment of the wall mask. In examples of implementation, each projected line segment is projected onto the nearest line segment of the wall mask among those presenting a collinearity with the projected line segment above a second predetermined collinearity threshold, which may be equal to the first predetermined collinearity threshold. This allows maintaining realism (i.e. acceptable meaning from the architectural point of view) of the result although the skeletonizing may have led to a loss of data. In particular, the skeletonizing may have introduced errors (e.g. gaps between a window or door and its supporting wall), and the examples correct such errors.

In examples, the first and/or second predetermined collinearity threshold(s) may be defined as a threshold on the (non-oriented) angle between two line segments. Said threshold may be defined as a function of the distribution of all angles formed by two contiguous walls in the training dataset. The collinearity threshold may be defined thanks to this distribution. For example, the value of the angle such that less than 5% of the angles formed by two contiguous walls are lower than this value. If said value is high (e.g. higher than 45°), it can be lowered to 30°. In practice, a value of the order of 30° provides good results.

In examples, the predetermined distance threshold may be defined as a function of other object instances such as windows or doors. It may be fixed to lower than 30% of the average width of a door or window, so as to allow obtaining few false positives. Most spacings between two substantially collinear walls lower than this threshold may be errors due to the line extraction algorithm. The two walls may thus be extended and merged.

Application S3 may take as input the semantic segmentation mask returned by the convolutional encoder-decoder neural network and may return the set of primitives required by the 3D floor plan reconstruction API.

A semantic segmentation mask of a 2D floor plan may be a line drawing image. Each line can have various thicknesses. The foreground pixels can have different values (e.g. colors) corresponding to the object classes the process seeks to identify.

The semantic segmentation mask may be processed through the following example steps in order to obtain a refined mask from which geometric primitives may be easily built.

1. Class-specific mask: First, the mask is split into several masks which each comprises the pixels related to a specific object class. In examples, the process may obtain one mask for walls, one for windows and one for doors.

2. Mask skeletonization: Then, a skeletonization process is applied on each class-specific mask. This process aims at thinning every lines. Two classical approaches may be used to perform the skeleton of a line drawing: the morphological approach and the distance transform approach. Tested implementations used the morphological skeleton approach, as described for example in paper "Morphological Skeleton Representation and Coding of Binary Images", IEEE October 1986, Petros A. Maragos, Ronald W. Schafer.
3. Line merging: Each class-specific skeletonized mask is composed of multiple small line segments which may be merged in order to obtain a skeletonized mask with the smallest possible number of line segments. The developed algorithm is as follows:
   a. For every pair of line segments, if they are nearly collinear and the distance between the two segments is below a predefined class-specific threshold, the two segments are replaced by a single line segment corresponding to the merging of the two line segments.
   b. While segment pairs have been merged in the previous a. step, return to a. step. Otherwise, return the final set of line segments.
4. Line joining; This step is only applied on the wall-specific mask. The processed mask returned by step 3 comprises a set of line segments corresponding to straight walls. This step consists in detecting where there is a junction between two straight walls and modifying the corresponding line segments by joining their extremity. The developed algorithm is as follows:
   a. For every pair of line segments, if they are not collinear and the distance between the two segments is below a predefined threshold, the two segments are modified such that one of their endpoints overlaps with the point corresponding to the intersection between the two lines containing the two segments.
   b. While segment pairs have been modified in the previous a. step, return to a. step. Otherwise, return the final set of line segments.
5. Class-specific mask merging and refinement: This final step consists in refining the localization of windows and doors. In the corresponding window-specific and door-specific masks returned by step 3, each line corresponds to a window (resp. door). First, every class-specific masks are superimposed. As line segments corresponding to windows and doors may not be properly collinear with a wall line segment, the process may replace each window and door line segment by their projection on the nearest wall line which has the same direction.

The next step may consist in constructing 3D primitives required by the 3D reconstruction API such as wall primitives, door primitives and window primitives. For instance, the wall primitive may be defined by the following attributes: coordinates of the two endpoints, thickness, height, references of the adjacent walls. Thanks to the refined mask, wall, window and door primitives may be easily built. Indeed, information such as coordinates of endpoints, reference of adjacent walls, reference of the wall to which a window (resp. door) belongs can be easily extracted from the refined mask. Other information such as wall/window/door height or width may be predefined or provided by a user.

FIGS. 12-19 illustrate an example of S2-S3 based on a function learnt according to the tested learning S1.

Figure 12:
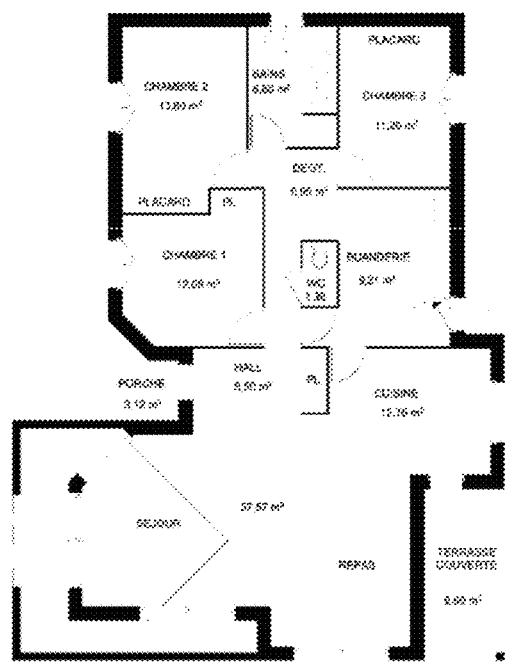

FIG. 12 shows an input 2D floor plan provided at S30.

Figure 13:
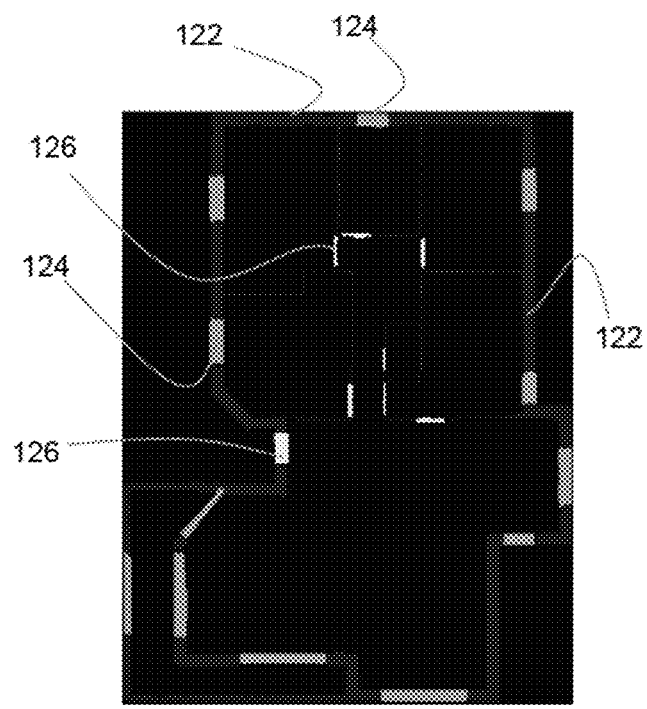

FIG. 13 shows a semantic segmentation of the 2D floor plan determined at S40, with walls 122 windows 124 and doors 126.

Figure 14:
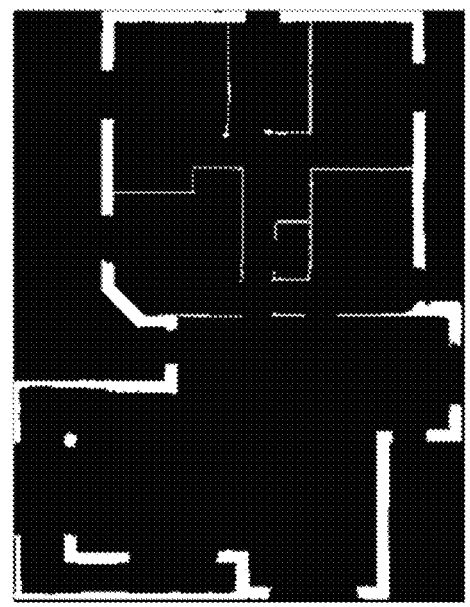
Figure 15:
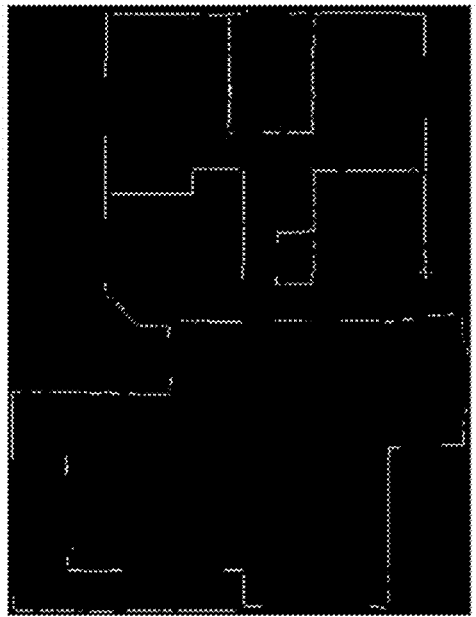
Figure 16:
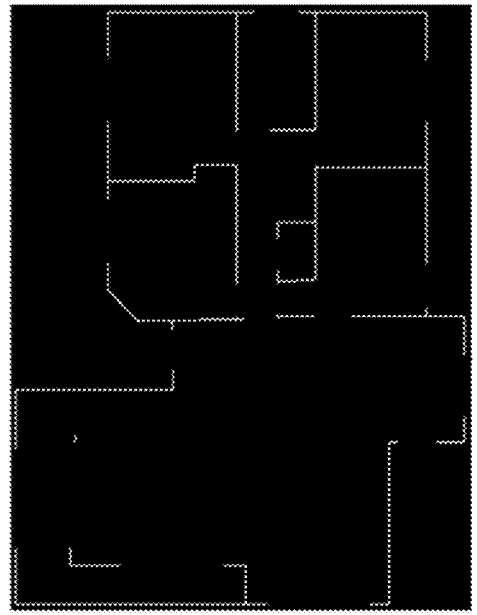

FIGS. 14-16 illustrate S50 and processing of the mask respective to the wall class. FIG. 14 shows the image of the mask respective to the wall class. FIG. 15 shows extraction of geometrical primitives of the type "line segment". FIG. 15 shows the output of the wall merging and junction steps. As can be seen, a reduced number of walls is obtained.

Figure 17:
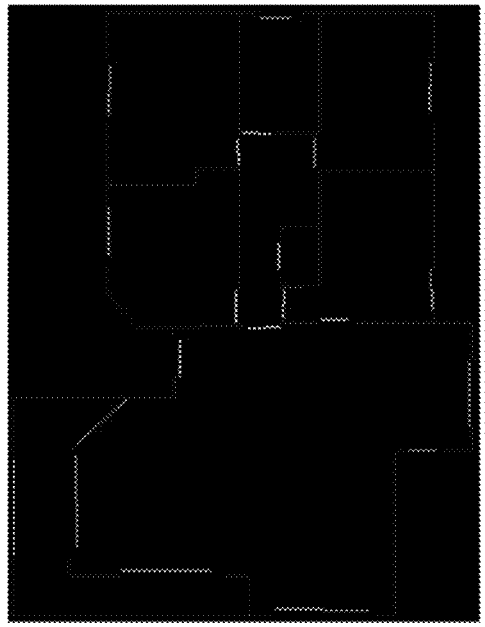

FIG. 17 shows the merging of the three masks.

Figure 18:
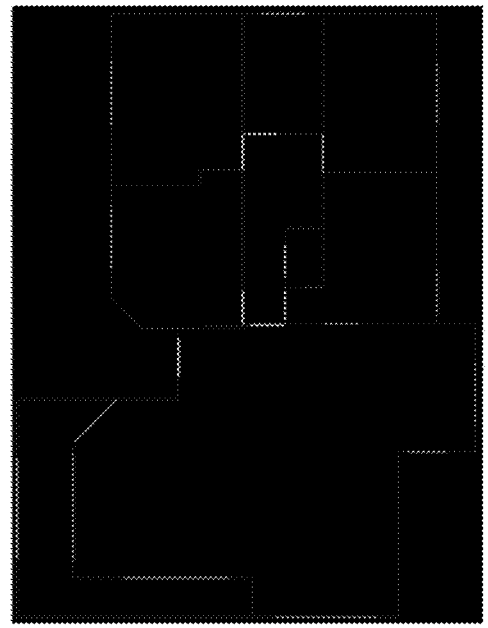

FIG. 18 shows the refinement, which allows generating a 2D model at S60.

Figure 19:
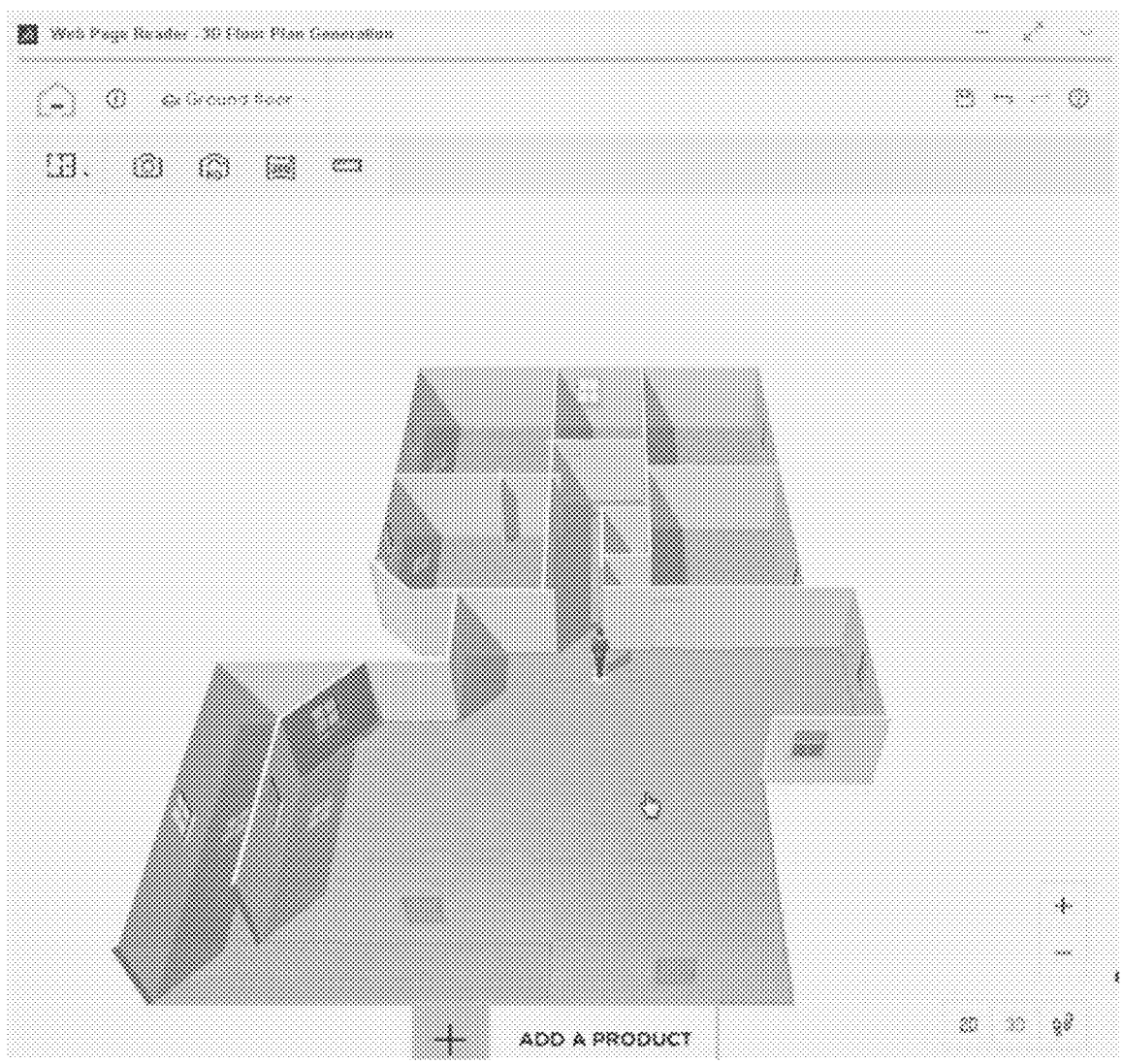

FIG. 19 shows determination at S70 of a 3D model simply by adding a height to each geometric primitive of the 2D model. As can be seen, a 3D model corresponding to the input 2D floor plan of FIG. 12 can be obtained.

It is now referred back to the discussion in relation with FIG. 11, with respect notably to the offline learning, to present examples of a configuration for the function and the learning in line with this discussion.

In said configuration, the function is configured to determine a semantic segmentation of an input 2D floor plan representing a layout of a building. The function has a neural network presenting a convolutional encoder-decoder architecture. Notably, the function may have a single neural network presenting a convolutional encoder-decoder architecture (i.e. the function has no other neural network presenting a convolutional encoder-decoder architecture) or the function may be a neural network (e.g. a single neural network) presenting a convolutional encoder-decoder architecture.

In said configuration, the neural network comprises a pixel-wise classifier (e.g. a softmax classifier) with respect to a set of classes. In examples of said configuration, the neural network may further comprise an upsampling layer. The upsampling layer may for example be arranged before the pixel-wise classifier. The neural network may alternatively or additionally comprise a max-pooling layer. The max-pooling layer may for example be arranged after the pixel-wise classifier.

In said configuration, the set of classes comprises at least two classes among a wall class, a door class and a window class. In examples of said configuration, the set of classes may comprise the wall class, the door class, and the window class, in examples, the set of classes may alternatively or additionally comprise a background class. In options, the set of classes consists of the wall class, the door class, the window class, and the background class.

The pixel-wise classifier may output, for each pixel of a 2D floor plan input image, respective data for inference of any class of the set of classes. Thus, for at least one semantic segmentation of a 2D floor plan input image (in the dataset or not) having first pixels representing an object/instance of a first class different from a background class (e.g. a wall) and second pixels representing an object/instance of a second class different from a background class (e.g. a door or a window), the pixel-wise classifier may output data for inference of the first class for the first pixels, and data for inference of the second class for the second pixels.

In said configuration, learning the function is based on a provided dataset (e.g. a training dataset). The provided dataset comprises 2D floor plans each associated to (e.g. annotated with) a respective semantic segmentation (e.g. a respective ground truth semantic segmentation).

The neural network may comprise weights and the learning may comprise, with an optimization algorithm, updating the weights according to the dataset and to a loss function.

Notably, the learning may comprise a single optimization algorithm (i.e. the learning comprises no other optimization algorithm). In such examples, the (e.g. single) optimization algorithm may be a stochastic gradient descent. The neural network may be trained after said (e.g. single) stochastic gradient descent, and thus its weights may be definitely set at that time, including those of the pixel-wise classifier. Additionally or alternatively, in such examples, the loss function may be a cross-entropy loss function.

The pixel-wise classifier may output, for each input 2D floor plan, respective data for inference of a semantic segmentation mask of the input 2D floor plan. The semantic segmentation mask is a pixel-wise classification of the 2D floor plan with respect to the set of classes. "For inference of a semantic segmentation mask" means any data allowing obtaining the semantic segmentation mask. For example, it may be data directly associating each pixel of the 2D floor plan to a single class (i.e. a semantic segmentation mask), or alternatively other data based on which the semantic segmentation mask may be indirectly determined (e.g. a distribution of probabilities over the set of classes respectively associated to each pixel). In such examples, the loss function may penalize, for each 2D floor plan of the dataset, inference of a semantic segmentation mask erroneous relative to the respective semantic segmentation associated to the 2D floor plan in the dataset. In other words and as previously discussed, the loss function may correspond to an error between the semantic segmentation mask and the respective semantic segmentation associated to the 2D floor plan in the dataset. Notably, the pixel-wise classifier may be a single layer of the neural network. This results in the data for inference being outputted by said single layer. In other words, the pixel-wise classifier is configured for handling all the classes of the semantic segmentation. This increases the robustness of the semantic segmentation. Indeed, classes are inferred based on data outputted by a single layer which reduces the risk of ambiguities (e.g. classes overlapping). Also, the pixel-wise classifier allows reducing mistakes due to error propagation of solutions proceeding class-by-class.

In examples of said configuration, the pixel-wise classifier may output, for each pixel of an input 2D floor plan, respective data for inference of a class of the set of classes. In such examples, the loss function may penalize, for each pixel of each 2D floor plan of the dataset, inference of a respective class different from a class provided for said pixel by the respective semantic segmentation (e.g. the ground truth semantic segmentation) associated to the 2D floor plan in the dataset. Notably, the respective data for inference of a class of the set of classes enables the determination of a single class from the set of classes for each pixel. In such examples, for at least one input 2D floor plan, the pixel-wise classifier may output data for inference of a first class among the at least two classes, for at least one first pixel of the input 2D floor plan, and data for inference of a second class among the at least two classes, for at least one second pixel of the input 2D floor plan (the first and second classes being different and the first and second pixel being also different). Such a pixel-wise classifier thus reduces the risk of a pixel being associated to more than one class.

In examples of said configuration, the respective data outputted by the pixel-wise classifier may comprise a distribution of probabilities over the set of classes. For example, for each respective pixel of an input 2D floor plan, the respective data may comprise a number (e.g. the number of classes) of probabilities for the respective pixel to be associated with a number (e.g. all classes, e.g. the at least two classes) of classes of the set of classes, so that one probability corresponding to one class. In such examples, the neural network may further comprise a max-pooling layer arranged after the pixel-wise classifier. The max-pooling layer may determine one class among the set of classes for each pixel of an input 2D floor plan. The determined class may be the class with the highest probability among the distribution of probabilities comprised in the respective data outputted by the pixel-wise classifier.

For example, the data for inference may comprise a first probability for a respective pixel to be associated with a first class among the at least two classes and a second probability for the respective pixel to be associated with a second class among the at least two classes, the first class being different from the second class and the first probability being higher than the second probability (i.e. the first class is more probable than the second class). Then, the max-pooling layer associates the respective pixel with the first class.

In examples of said examples, the loss function may comprise a sum of loss terms, each relative to a respective pixel (i.e. a loss term is calculated for a respective pixel). The loss term penalizes smallness of a probability among the distribution of probabilities comprised in the respective data outputted by the pixel-wise classifier. In such examples, each pixel loss term may comprise a sum of values each value respectively calculated from a probability among the distribution of probabilities. The loss term may select a value among the values. The selecting may comprise choosing (e.g. keeping, specifying) a value calculated form a respective probability for a specific class. In examples, each loss term comprises an indicator according to which the selecting of a value is carried out. In examples, the indicator may be a binary indicator and may be a function of the class provided for a corresponding pixel in the ground truth image. For example, the binary indicator may be equal to 1 when the value is computed from a probability for a class corresponding to the provided class provided for a corresponding pixel in the ground truth image, and the binary indicator may be equal 0 when the value is computed from a probability for a class different from the class provided for a corresponding pixel in the ground truth image class. In examples, a loss term penalizes smallness if the value is large when the probability is small. For example, the value may be calculated from a given function a decreasing function of the predicted probability. In examples the given function may be a negative log function of the probability.

In examples, the loss may be written as:

$$Loss_{pixel} = -\sum_{i=1}^{C} y_{true}^i \log(y_{pred}^i)$$

C is the number of classes of the set of classes. i designates a class of the set of classes. $y_{true}^i$ is a binary indicator if class i is the class provided for the respective pixel by the respective semantic segmentation associated to the 2D floor plan in the dataset. $y_{pred}^i$ is a probability outputted by the pixel-wise classifier for class i.

Thus, the loss function may be a multinomial loss function (e.g. a multinomial logistic loss function). Such a loss function allows the classifier to manage multiple classes. This increases the accuracy of the semantic segmentation determined by the learnt neural network.

The invention claimed is:

1. A computer-implemented method for determining a function configured to determine a semantic segmentation of a 2D floor plan representing a layout of a building, the function having a neural network presenting a convolutional encoder-decoder architecture, the neural network comprising a pixel-wise classifier with respect to a set of classes comprising a wall class, a door class and a window class, the method comprising:
  obtaining a dataset comprising 2D floor plans each associated to a respective semantic segmentation; and
  learning the function based on the dataset,
  wherein the pixel-wise classifier is a single layer of the neural network consisting of a softmax classifier, the neural network includes weights, the neural network further comprising an upsampling layer being arranged before the softmax classifier and a max-pooling layer being arranged after the softmax classifier, and the learning includes, with a single optimization algorithm, updating the weights according to the dataset and to a loss function, wherein the optimization algorithm is a stochastic gradient descent, the weights of the neural network being definitely set after said stochastic gradient descent, including the weights of the softmax classifier and the max-pooling layer, the weights of the max-pooling layer being optimized by the learning,
  wherein the softmax classifier outputs, for each input 2D floor plan, respective data for inference of a semantic segmentation mask of the input 2D floor plan, the semantic segmentation mask being a pixel-wise classification of the 2D floor plan with respect to the set of classes, the loss function penalizing, for each 2D floor plan of the dataset, inference of a semantic segmentation mask erroneous relative to the respective semantic segmentation associated to the 2D floor plan in the dataset,
  wherein the softmax classifier outputs, for each pixel of an input 2D floor plan, respective data for inference of a class of the set of classes, the loss function penalizing, for each pixel of each 2D floor plan of the dataset, inference of a respective class different from a class provided for said pixel by the respective semantic segmentation associated to the 2D floor plan in the dataset, a determined class being the class with the highest probability among the distribution of probabilities comprised in the respective data outputted by the softmax classifier, the function thereby presenting a mean accuracy higher than 0.85 and/or a mean intersection-over-union higher than 0.75, such that ambiguities between the door class and the window class are reduced,
  wherein the respective data outputted by the softmax classifier comprises a distribution of probabilities over the set of classes, the softmax classifier thereby outputting a respective distribution of probabilities over the set of classes for each pixel, the loss function comprising a sum of loss terms each relative to a respective pixel, each loss term being of the type:

$$-\sum_{i=1}^{C} y_{true}^{i} \log(y_{pred}^{i})$$

where:
  C is the number of classes of the set of classes comprising the wall class, the door class and the window class,
  i designates a class of the set of classes,
  $y_{true}^{i}$ is a binary indicator if class i is the class provided for the respective pixel by the respective semantic segmentation associated to the 2D floor plan in the dataset, and
  $y_{pred}^{i}$ is a probability outputted by the softmax classifier for class i,
  wherein the loss function is multinomial.

2. The method of claim 1, wherein the neural network comprises weights, and the learning comprises, with an optimization algorithm, updating the weights according to the dataset and to a loss function.

3. The method of claim 2, wherein the optimization algorithm is a stochastic gradient descent.

4. The method of claim 3, wherein the loss function is a cross-entropy loss function.

5. The method of claim 1, wherein providing the dataset comprises:
  obtaining a database of 2D floor plans each associated to a respective 3D model; and
  determining for each 2D floor plan the respective semantic segmentation from the respective 3D model.

6. The method of claim 1, the set of classes consisting of the wall class, the door class and the window class.

7. A computer-implemented method comprising:
  determining a semantic segmentation of a 2D floor plan representing a layout of a building, by:
  obtaining the 2D floor plan, and
  applying a function to the 2D floor plan, the function being learnable according to a computer-implemented process for determining a function configured to determine a semantic segmentation of a 2D floor plan representing a layout of a building, the function having a neural network presenting a convolutional encoder-decoder architecture, the neural network comprising a pixel-wise classifier with respect to a set of classes comprising a wall class, a door class and a window class, the process including:
    obtaining a dataset comprising 2D floor plans each associated to a respective semantic segmentation, and
    learning the function based on the dataset,
  wherein the pixel-wise classifier is a single layer of the neural network consisting of a softmax classifier, the neural network includes weights, the neural network further comprising an upsampling layer being arranged before the softmax classifier and a max-pooling layer being arranged after the softmax classifier, and the learning includes, with a single optimization algorithm, updating the weights according to the dataset and to a loss function, wherein the optimization algorithm is a stochastic gradient descent, the weights of the neural network being definitely set after said stochastic gradient descent, including the weights of the softmax classifier and the max-pooling layer, the weights of the max-pooling layer being optimized by the learning,
  wherein the softmax classifier outputs, for each input 2D floor plan, respective data for inference of a semantic segmentation mask of the input 2D floor plan, the semantic segmentation mask being a pixel-wise classification of the 2D floor plan with respect to the set of classes, the loss function penalizing, for each 2D floor plan of the dataset, inference of a semantic segmentation mask erroneous relative to the respective semantic segmentation associated to the 2D floor plan in the dataset,
  wherein the softmax classifier outputs, for each pixel of an input 2D floor plan, respective data for inference of a class of the set of classes, the loss function penalizing, for each pixel of each 2D floor plan of the dataset, inference of a respective class different from a class provided for said pixel by the respective semantic segmentation associated to the 2D floor plan in the dataset, a determined class being the class with the highest probability among the distribution of probabilities comprised in the respective data outputted by the softmax classifier, the function thereby presenting a mean accuracy higher than 0.85 and/or a mean intersection-over-union higher than 0.75, such that ambiguities between the door class and the window class are reduced, wherein the respective data outputted by the softmax classifier comprises a distribution of probabilities over the set of classes, the softmax classifier thereby outputting a respective distribution of probabilities over the set of classes for each pixel, the loss function comprising a sum of loss terms each relative to a respective pixel, each loss term being of the type:

$$-\sum_{i=1}^{C} y_{true}^{i} \log(y_{pred}^{i})$$

where:
C is the number of classes of the set of classes comprising the wall class, the door class and the window class,
i designates a class of the set of classes,
$y_{true}^{i}$ is a binary indicator if class i is the class provided for the respective pixel by the respective semantic segmentation associated to the 2D floor plan in the dataset, and
$y_{pred}^{i}$ is a probability outputted by the pixel wise classifier softmax classifier for class i,
wherein the loss function is multinomial.

8. The computer-implemented method of claim 7 further comprising:
obtaining a 2D floor plan representing a layout of the building; and
generating a 3D model representing the building based on the semantic segmentation.

9. A device comprising:
a non-transitory data storage medium having stored thereon a computer program comprising instructions for determining a function configured to determine a semantic segmentation of a 2D floor plan representing a layout of a building, the function having a neural network presenting a convolutional encoder-decoder architecture, the neural network comprising a pixel-wise classifier with respect to a set of classes comprising a wall class, a door class and a window class, the computer program, when executed by a processor, causes the processor to be configured to
obtain a dataset comprising 2D floor plans each associated to a respective semantic segmentation; and
learn the function based on the dataset,
wherein the pixel-wise classifier is a single layer of the neural network consisting of a softmax classifier, the neural network includes weights, the neural network further comprising an upsampling layer being arranged before the softmax classifier and a max-pooling layer being arranged after the softmax classifier, and the learning includes, with a single optimization algorithm, updating the weights according to the dataset and to a loss function, wherein the optimization algorithm is a stochastic gradient descent, the weights of the neural network being definitely set after said stochastic gradient descent, including the weights of the softmax classifier and the max-pooling layer, the weights of the max-pooling layer being optimized by the learning, wherein the softmax classifier outputs, for each input 2D floor plan, respective data for inference of a semantic segmentation mask of the input 2D floor plan, the semantic segmentation mask being a pixel-wise classification of the 2D floor plan with respect to the set of classes, the loss function penalizing, for each 2D floor plan of the dataset, inference of a semantic segmentation mask erroneous relative to the respective semantic segmentation associated to the 2D floor plan in the dataset, wherein the softmax classifier outputs, for each pixel of an input 2D floor plan, respective data for inference of a class of the set of classes, the loss function penalizing, for each pixel of each 2D floor plan of the dataset, inference of a respective class different from a class provided for said pixel by the respective semantic segmentation associated to the 2D floor plan in the dataset, a determined class being the class with the highest probability among the distribution of probabilities comprised in the respective data outputted by the softmax classifier, the function thereby presenting a mean accuracy higher than 0.85 and/or a mean intersection-over-union higher than 0.75, such that ambiguities between the door class and the window class are reduce, wherein the respective data outputted by the softmax classifier comprises a distribution of probabilities over the set of classes, the softmax classifier thereby outputting a respective distribution of probabilities over the set of classes for each pixel, the loss function comprising a sum of loss terms each relative to a respective pixel, each loss term being of the type:

$$-\sum_{i=1}^{C} y_{true}^{i} \log(y_{pred}^{i})$$

where:
C is the number of classes of the set of classes comprising the wall class, the door class and the window class,
i designates a class of the set of classes,
$y_{true}^{i}$ is a binary indicator if class i is the class provided for the respective pixel by the respective semantic segmentation associated to the 2D floor plan in the dataset, and
$y_{pred}^{i}$ is a probability outputted by the softmax classifier for class i,
wherein the loss function is multinomial and the pixel-wise classifier is a softmax classifier, and
wherein the loss function is multinomial.

10. The non-transitory data storage medium of claim 9, wherein the neural network comprises weights, and the learning comprises, with an optimization algorithm, updating the weights according to the dataset and to a loss function.

11. The device of claim 9, wherein the device further comprises the processor coupled to the data storage medium.

12. A device comprising:
a non-transitory data storage medium having recorded thereon a computer program that when executed by a processor causes the processor to be configured to:
determine a semantic segmentation of a 2D floor plan representing a layout of a building, by being configured to:
  obtain the 2D floor plan, and
  apply a function to the 2D floor plan, the function being learnable according to a computer-implemented process for determining a function configured to determine a semantic segmentation of a 2D floor plan representing a layout of a building, the function having a neural network presenting a convolutional encoder-decoder architecture, the neural network comprising a pixel-wise classifier with respect to a set of classes comprising a wall class, a door class and a window class, the process causing the processor to be configured to:
    obtain a dataset comprising 2D floor plans each associated to a respective semantic segmentation, and
    learn the function based on the dataset,
wherein the pixel-wise classifier is a single layer of the neural network consisting of a softmax classifier, the neural network includes weights, the neural network further comprising an upsampling layer being arranged before the softmax classifier and a max-pooling layer being arranged after the softmax classifier, and the learning includes, with a single optimization algorithm, updating the weights according to the dataset and to a loss function,
wherein the optimization algorithm is a stochastic gradient descent, the weights of the neural network being definitely set after said stochastic gradient descent, including the weights of the softmax classifier and the max-pooling layer, the weights of the max-pooling layer being optimized by the learning,
wherein the softmax classifier outputs, for each input 2D floor plan, respective data for inference of a semantic segmentation mask of the input 2D floor plan, the semantic segmentation mask being a pixel-wise classification of the 2D floor plan with respect to the set of classes, the loss function penalizing, for each 2D floor plan of the dataset, inference of a semantic segmentation mask erroneous relative to the respective semantic segmentation associated to the 2D floor plan in the dataset,
wherein the softmax classifier outputs, for each pixel of an input 2D floor plan, respective data for inference of a class of the set of classes, the loss function penalizing, for each pixel of each 2D floor plan of the dataset, inference of a respective class different from a class provided for said pixel by the respective semantic segmentation associated to the 2D floor plan in the dataset, a determined class being the class with the highest probability among the distribution of probabilities comprised in the respective data outputted by the softmax classifier, the function thereby presenting a mean accuracy higher than 0.85 and/or a mean intersection-over-union higher than 0.75, such that ambiguities between the door class and the window class are reduced,
wherein the respective data outputted by the softmax classifier comprises a distribution of probabilities over the set of classes, the softmax classifier thereby outputting a respective distribution of probabilities over the set of classes for each pixel, the loss function comprising a sum of loss terms each relative to a respective pixel, each loss term being of the type:

$$-\sum_{i=1}^{C} y_{true}^{i} \log(y_{pred}^{i})$$

where:
  C is the number of classes of the set of classes comprising the wall class, the door class and the window class,
  i designates a class of the set of classes,
  $y_{true}^{i}$ is a binary indicator if class i is the class provided for the respective pixel by the respective semantic segmentation associated to the 2D floor plan in the dataset, and
  $y_{pred}^{i}$ is a probability outputted by the softmax classifier for class i,
wherein the loss function is multinomial.

13. The device of claim 12, wherein the device further comprises the processor coupled to the data storage medium.

* * * * *